US012206375B2

(12) United States Patent
Uemichi

(10) Patent No.: US 12,206,375 B2
(45) Date of Patent: Jan. 21, 2025

(54) DIGITAL PHASE SHIFT CIRCUIT AND DIGITAL PHASE SHIFTER

(71) Applicant: Fujikura Ltd., Tokyo (JP)

(72) Inventor: Yusuke Uemichi, Sakura (JP)

(73) Assignee: FUJIKURA LTD., Tokyo (JP)

(*) Notice: Subject to any disclaimer, the term of this patent is extended or adjusted under 35 U.S.C. 154(b) by 0 days.

(21) Appl. No.: 18/018,357

(22) PCT Filed: Aug. 18, 2022

(86) PCT No.: PCT/JP2022/031153
§ 371 (c)(1),
(2) Date: Jan. 27, 2023

(87) PCT Pub. No.: WO2023/181449
PCT Pub. Date: Sep. 28, 2023

(65) Prior Publication Data
US 2024/0258998 A1    Aug. 1, 2024

(30) Foreign Application Priority Data
Mar. 22, 2022  (JP) .................................. 2022-046122

(51) Int. Cl.
H03H 11/16    (2006.01)
H01P 1/18     (2006.01)
H03H 7/18     (2006.01)

(52) U.S. Cl.
CPC ............. *H03H 11/16* (2013.01); *H01P 1/184* (2013.01); *H03H 7/185* (2013.01)

(58) Field of Classification Search
None
See application file for complete search history.

(56) References Cited

U.S. PATENT DOCUMENTS 6,556,102 B1   4/2003   Sengupta et al.
6,816,031 B1   11/2004  Miller
(Continued)

FOREIGN PATENT DOCUMENTS

CN   106785250 A   5/2017
CN   109616723 A   4/2019
(Continued)

OTHER PUBLICATIONS

W/Japanese International Search Report dated Oct. 18, 2022, issued in counterpart International Application No. PCT/JP2022/031153. (3 pages).
(Continued)

*Primary Examiner* — Jeffrey S Zweizig
(74) *Attorney, Agent, or Firm* — WHDA, LLP

(57) ABSTRACT

A digital phase shift circuit includes: a signal line that extends in a predetermined direction; a first inner line that is separated from a first side of the signal line; a second inner line that is separated from a second side of the signal line; an outer line that is provided at a position which is farther from the signal line than the first inner line or the second inner line on a first side or a second side; a first grounding conductor that is provided at each of first ends of the first inner line, the second inner line, and the outer line; a second grounding conductor that is provided at a second end of the outer line; a first electronic switch that is provided between a second end of the first inner line and the second grounding conductor; and a second electronic switch that is provided between a second end of the second inner line and the second grounding conductor.

11 Claims, 4 Drawing Sheets

(56) References Cited

U.S. PATENT DOCUMENTS

| | | | | |
|---|---|---|---|---|
| 10,291,282 B1* | 5/2019 | Lin | ............ | H04B 1/52 |
| 10,608,335 B2* | 3/2020 | Valdes Garcia | ......... | H04B 1/00 |
| 10,680,581 B2* | 6/2020 | Valdes Garcia | ........ | H01P 1/127 |
| 12,040,765 B1* | 7/2024 | Uemichi | ................ | H03H 11/16 |
| 2014/0312986 A1 | 10/2014 | Edelstein et al. | | |
| 2019/0157754 A1 | 5/2019 | Valdes Garcia et al. | | |
| 2019/0158068 A1 | 5/2019 | Valdes Garcia et al. | | |

FOREIGN PATENT DOCUMENTS

| | | | |
|---|---|---|---|
| CN | 111326839 A | 6/2020 | |
| JP | 2011-259215 A | 12/2011 | |
| JP | 2016-158035 A | 9/2016 | |

OTHER PUBLICATIONS

Tousi et al., "A Ka-band Digitally-Controlled Phase Shifter with sub-degree Phase Precision", 2016 IEEE Radio Frequency Integrated Circuits Symposium, pp. 356-359. Cited in Specification. (4 pages).

* cited by examiner

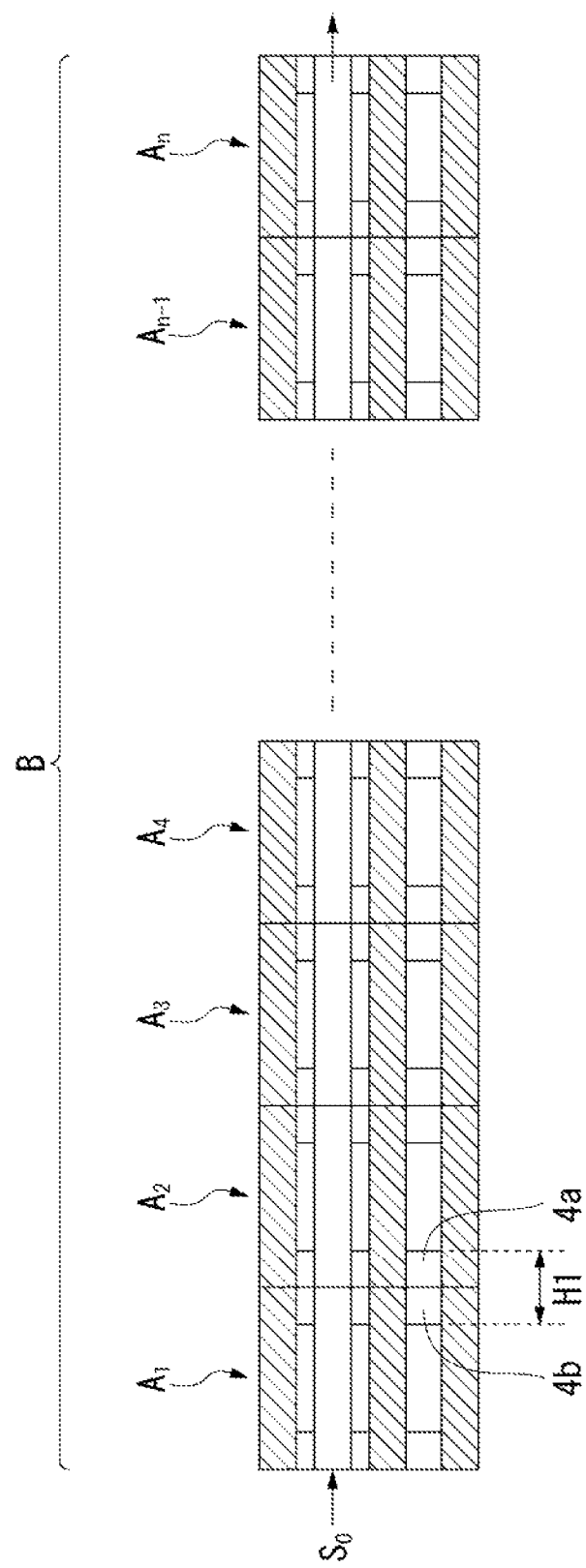

DIGITAL PHASE SHIFT CIRCUIT AND DIGITAL PHASE SHIFTER

TECHNICAL FIELD

The present invention relates to a digital phase shift circuit and a digital phase shifter.

Priority is claimed on Japanese Patent Application No. 2022-046122, filed Mar. 22, 2022, the content of which is incorporated herein by reference.

BACKGROUND ART

A digital-controlled phase shift circuit (a digital phase shift circuit) for microwaves, submillimeter waves, or millimeter waves is disclosed in Non-Patent Document 1. As illustrated in FIG. 2 of Non-Patent Document 1, the digital phase shift circuit includes a linear signal line, a pair of linear inner grounding lines that are provided on both sides of the signal line and are parallel to the signal line, a pair of linear outer grounding lines that are provided on the sides of the pair of inner grounding lines opposite to the signal line, that is, far sides from the signal line, and are parallel to the pair of inner grounding lines, a linear first grounding bar that is connected to each of first ends of the pair of inner grounding lines and the pair of outer grounding lines, a linear second grounding bar that is connected to each of second ends of the pair of outer grounding lines, and a pair of NMOS switches that are provided between each of the second ends of the pair of inner grounding lines and the second grounding bar.

The digital phase shift circuit switches an operation mode between a low delay mode and a high delay mode by switching a return current flowing in the pair of inner grounding lines or the pair of outer grounding lines due to transmission of signal waves in the signal line according to turning-on/off of the pair of NMOS switches. That is, the operation mode of the digital phase shift circuit is switched to the low delay mode when a return current flows in the pair of inner grounding lines, and the operation mode is switched to the high delay mode when a return current flows in the pair of outer grounding lines.

CITATION LIST

Non-Patent Document

Non-Patent Document 1

A Ka-band Digitally-Controlled Phase Shifter with subdegree Phase Precision (2016, IEEE, RFIC)

SUMMARY OF INVENTION

Technical Problem

The digital phase shift circuit is applied to, for example, a base station using a phased array antenna or the like and is actually mounted on a semiconductor substrate in a state in which a plurality of digital phase shift circuits are connected in cascade. That is, the digital phase shift circuit is a basic unit in an actual configuration of a phase shifter, and a desired function is realized by connecting several tens of digital phase shift circuits in cascade.

In a mobile communication terminal, since a mounting area corresponding to the number of digital phase shift circuits (basic units) is necessary, there is a technical problem that the mounting area needs to be decreased by minimizing a mounting area of each digital phase shift circuit (basic unit). That is, a decrease in size is an important technical problem in order to improve practicability of a digital phase shift circuit.

The present invention has been made in consideration of the aforementioned circumstances and an objective thereof is to provide a digital phase shift circuit and a digital phase shifter that enable a decrease in size in comparison with the related art.

Solution to Problem

In order to achieve the aforementioned objective, in a first aspect of the present invention, there is provided a digital phase shift circuit including: a signal line that extends in a predetermined direction; a first inner line that is separated from a first side of the signal line; a second inner line that is separated from a second side of the signal line; an outer line that is provided at a position which is farther from the signal line than from the first inner line or the second inner line on the first side or the second side; a first grounding conductor that is provided at each of first end sides of the first inner line, the second inner line, and the outer line; a second grounding conductor that is provided at a second end side of the outer line; a first connection conductor that connects the first end of the first inner line and the first grounding conductor; a second connection conductor that connects the first end of the second inner line and the first grounding conductor: a third connection conductor that connects the first end of the outer line and the first grounding conductor; a fourth connection conductor that connects the second end of the outer line and the second grounding conductor; a first electronic switch that disconnectably connects the second end of the first inner line and the second grounding conductor; and a second electronic switch that disconnectably connects the second end of the second inner line and the second grounding conductor.

In a digital phase shift circuit according to a second aspect of the present invention, in the digital phase shift circuit according to the first aspect, the first grounding conductor and the second grounding conductor are formed of multiple layers outside of the first inner line and the second inner line.

In a digital phase shift circuit according to a third aspect of the present invention, in the digital phase shift circuit according to the first aspect, the outer line has a width larger than a width of the first inner line and a width of the second inner line and is formed of multiple layers.

In a digital phase shift circuit according to a fourth aspect of the present invention, in the digital phase shift circuit according to the first aspect, the first grounding conductor and the second grounding conductor are formed of multiple layers outside of the first inner line and the second inner line, and the outer line has a width larger than a width of the first inner line and a width of the second inner line and is formed of multiple layers.

In a digital phase shift circuit according to a fifth aspect of the present invention, in the digital phase shift circuit according to any one of the first to fourth aspects, the first inner line, the second inner line, and the outer line are formed in a first conductive layer, and the first grounding conductor and the second grounding conductor are formed in a second conductive layer which faces the first conductive layer with an insulating layer interposed therebetween.

In a digital phase shift circuit according to a sixth aspect of the present invention, in the digital phase shift circuit according to any one of the first to fifth aspects, the first electronic switch and the second electronic switch are set to a simultaneously closed state in a low delay mode and are set to a simultaneously open state in a high delay mode.

In a digital phase shift circuit according to a seventh aspect of the present invention, in the digital phase shift circuit according to any one of the first to sixth aspects, the first electronic switch and the second electronic switch are field-effect transistors, and a size of the field-effect transistors is equal to or greater than a summed length of a width of the first grounding conductor and a width of the second grounding conductor.

In a digital phase shift circuit according to an eighth aspect of the present invention, in the digital phase shift circuit according to any one of the first to seventh aspects, a capacitor of which an upper electrode is connected to the signal line and a lower electrode is connected to at least one of the first grounding conductor and the second grounding conductor is further included.

In a digital phase shift circuit according to a ninth aspect of the present invention, in the digital phase shift circuit according to the eighth aspect, an electronic switch for a capacitor that is provided between the lower electrode of the capacitor and at least one of the first grounding conductor and the second grounding conductor is further included.

In a digital phase shift circuit according to a tenth aspect of the present invention, in the digital phase shift circuit according to the ninth aspect, the electronic switch for the capacitor is set to an open state in a low delay mode and is set to a closed state in a high delay mode.

In a digital phase shifter according to an eleventh aspect of the present invention, a plurality of the digital phase shift circuits according to any one of the first to tenth aspects are connected in cascade.

Advantageous Effects of Invention

According to the aspects of the present invention, it is possible to provide a digital phase shift circuit and a digital phase shifter that enable a decrease in size in comparison with the related art.

BRIEF DESCRIPTION OF DRAWINGS

FIG. 4 is a conceptual diagram illustrating a functional configuration of a digital phase shifter B according to an embodiment of the present invention.

DESCRIPTION OF EMBODIMENTS

Hereinafter, an embodiment of the present invention will be described with reference to the accompanying drawings.

Figure 1:
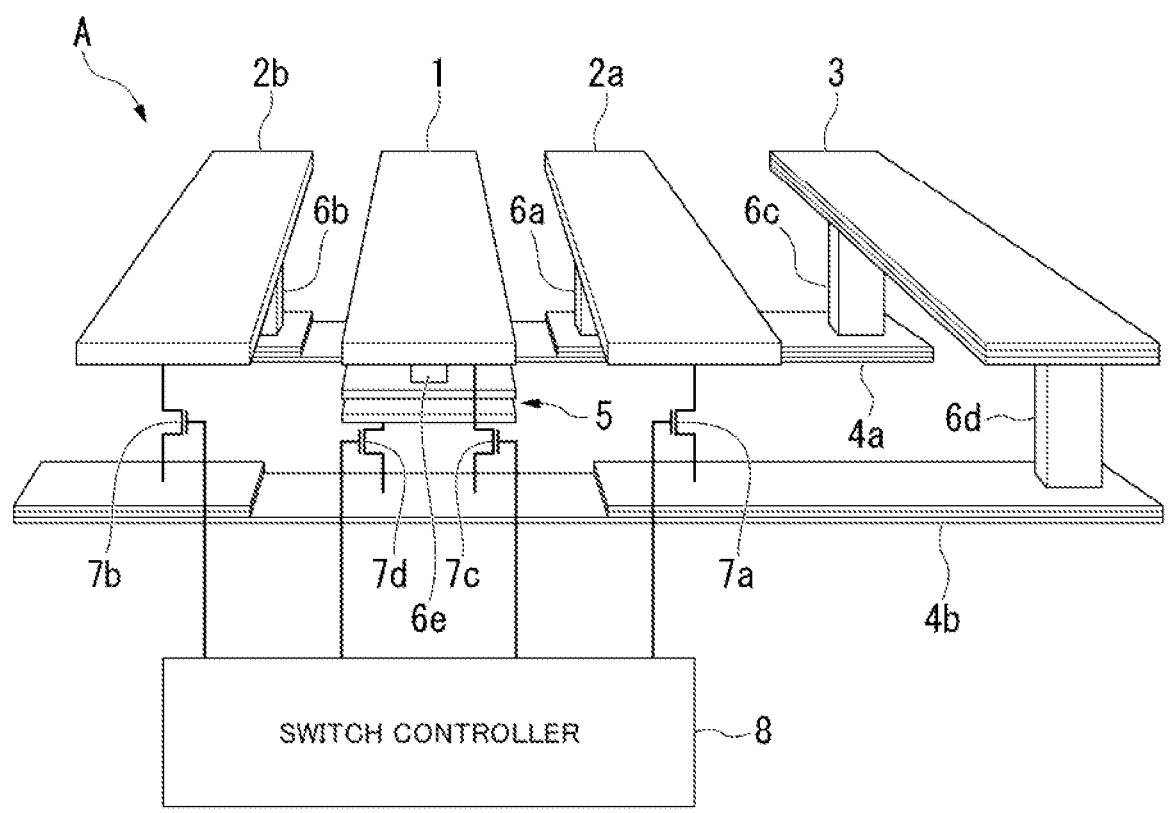
FIG. 1 is a conceptual diagram illustrating a functional configuration of a digital phase shift circuit A according to an embodiment of the present invention.

As illustrated in FIG. 1, a digital phase shift circuit A according to the embodiment includes a signal line 1, a first inner line 2a, a second inner line 2b, an outer line 3, a first grounding conductor 4a, a second grounding conductor 4b, a capacitor 5, a first connection conductor 6a, a second connection conductor 6b, a third connection conductor 6c, a fourth connection conductor 6d, a fifth connection conductor 6e, a first electronic switch 7a, a second electronic switch 7b, a third electronic switch 7c, a fourth electronic switch 7d, and a switch controller 8.

The signal line 1 is a linear band-shaped conductor that extends in a predetermined direction. That is, the signal line 1 is a long plate-shaped conductor that has a fixed width, a fixed thickness, and a predetermined length. In the signal line 1, a signal current flows from a near side to a far side, that is, to a first end (an output end) on the far side from a second end (an input end) on the near side. The signal current is a high-frequency signal with a wavelength range of microwaves, submillimeter waves, or millimeter waves.

The signal line 1 has an inductance L1 which is a distributed circuit constant from electrical point of view. The inductance L1 is a parasitic inductance with a magnitude corresponding to the shape of the signal line 1 such as a length of the signal line 1. The signal line 1 also has a capacitance C1 which is a distributed circuit constant from electrical point of view. The capacitance C1 is a parasitic capacitance between the signal line 1 and the first inner line 2a or the second inner line 2b, between the signal line 1 and the outer line 3, or between silicon substrates in each of which the digital phase shift circuit A is provided.

The first inner line 2a is a linear band-shaped conductor that is separated to a first side (the right side in FIG. 1) of the signal line 1. The first inner line 2a is a long plate-shaped conductor that has a fixed width, a fixed thickness, and a predetermined length. That is, the first inner line 2a is provided parallel to the signal line 1 with a predetermined distance therebetween. That is, the first inner line 2a extends in the same direction as the extension direction of the signal line 1.

The second inner line 2b is a linear band-shaped conductor that is separated to a second side (the left side in FIG. 1) of the signal line 1. The second inner line 2b is a long plate-shaped conductor that has a fixed width, a fixed thickness, and a predetermined length similarly to the first inner line 2a. The second inner line 2b is provided parallel to the signal line 1 with the same distance as the first inner line 2a has with respect to the signal line 1. That is, the second inner line 2b extends in the same direction as the extension direction of the signal line 1 similarly to the first inner line 2a.

The outer line 3 is a linear band-shaped conductor that is provided at a position farther from the signal line 1 than the first inner line 2a on the first side of the signal line 1. The outer line 3 is a long plate-shaped conductor that has a fixed width, a fixed thickness, and a predetermined length. The outer line 3 is provided parallel to the signal line 1 with a predetermined distance therebetween in a state in which the first inner line 2a is interposed therebetween. The outer line 3 extends in the same direction as the extension direction of the signal line 1 similarly to the first inner line 2a and the second inner line 2b.

The outer line 3 may be provided on the second side of the signal line 1, that is, at a position farther from the signal line 1 than the second inner line 2b, instead of the first side of the signal line 1. That is, the outer line 3 is provided at a position farther from the signal line 1 than the first inner line 2a or the second inner line 2b on the first side of the second side of the signal line 1.

The first grounding conductor 4a is a linear band-shaped conductor that is provided at each of first end sides of the first inner line 2a, the second inner line 2b, and the outer line 3. The first grounding conductor 4a is a long plate-shaped conductor that has a fixed width, a fixed thickness, and a predetermined length and is electrically grounded.

The first grounding conductor 4a is provided to be perpendicular to the first inner line 2a, the second inner line 2b, and the outer line 3 which extend in the same direction. The first grounding conductor 4a is provided a predetermined distance below the first inner line 2a, the second inner line 2b, and the outer line 3 to extend in the left and right direction at each of the first end sides of the first inner line 2a, the second inner line 2b, and the outer line 3.

Here, the first grounding conductor 4a is provided such that a first end in the left and right direction (the right end in FIG. 1) is located substantially at the same position as the right edge portion of the outer line 3. The first grounding conductor 4a is provided such that a second end in the left and right direction (the left end in FIG. 1) is located substantially at the same position as the left edge portion of the second inner line 2b.

The second grounding conductor 4b is a linear band-shaped conductor that is provided at each of second end sides of the first inner line 2a, the second inner line 2b, and the outer line 3. The second grounding conductor 4b is a long plate-shaped conductor that has a fixed width, a fixed thickness, and a predetermined length similarly to the first grounding conductor 4a and is electrically grounded similarly to the first grounding conductor 4a.

The second grounding conductor 4b is provided to be perpendicular to the first inner line 2a, the second inner line 2b, and the outer line 3 which extend in the same direction similarly to the first grounding conductor 4a. The second grounding conductor 4b is provided a predetermined distance below the first inner line 2a, the second inner line 2b, and the outer line 3 to extend in the left and right direction at each of the second end sides of the first inner line 2a, the second inner line 2b, and the outer line 3.

Here, the second grounding conductor 4b is provided such that a first end in the left and right direction (the right end in FIG. 1) is located substantially at the same position as the right edge portion of the outer line 3. The second grounding conductor 4b is provided such that a second end in the left and right direction (the left end in FIG. 1) is located substantially at the same position as the left edge portion of the second inner line 2b. That is, the second grounding conductor 4b is located at the same position in the left and right direction as the first grounding conductor 4a.

The capacitor 5 is parallel plates of which an upper electrode is connected to the signal line 1 via the fifth connection conductor 6e and a lower electrode is connected to the second grounding conductor 4b via the fourth electronic switch 7d. The capacitor 5 has a capacitance Ca corresponding to an opposing area of the parallel plates. That is, the capacitance Ca is a circuit constant that is provided between the signal line 1 and the second grounding conductor 4b.

The first connection conductor 6a is a conductor that electrically and mechanically connects the first end of the first inner line 2a and the first grounding conductor 4a. That is, the first connection conductor 6a is a conductor extending in the vertical direction, a first end (an upper end) thereof is connected to the lower surface of the first inner line 2a, and a second end (a lower end) thereof is connected to the upper surface of the first grounding conductor 4a.

The second connection conductor 6b is a conductor that electrically and mechanically connects a first end of the second inner line 2b and the first grounding conductor 4a. That is, the second connection conductor 6b is a conductor extending in the vertical direction similarly to the first connection conductor 6a, a first end (an upper end) thereof is connected to the lower surface of the second inner line 2b, and a second end (a lower end) thereof is connected to the upper surface of the first grounding conductor 4a.

The third connection conductor 6c is a conductor that electrically and mechanically connects a first end of the outer line 3 and the first grounding conductor 4a. That is, the third connection conductor 6c is a conductor extending in the vertical direction, a first end (an upper end) thereof is connected to the lower surface of the outer line 3 at the first end thereof, and a second end (a lower end) thereof is connected to the upper surface of the first grounding conductor 4a.

The fourth connection conductor 6d is a conductor that electrically and mechanically connects the second end of the outer line 3 and the second grounding conductor 4b. That is, the fourth connection conductor 6d is a conductor extending in the vertical direction, a first end (an upper end) thereof is connected to the lower surface of the outer line 3 at the second end thereof, and a second end (a lower end) thereof is connected to the upper surface of the second grounding conductor 4b.

The fifth connection conductor 6e is a conductor that electrically and mechanically connects the second end of the signal line 1 and the upper electrode of the capacitor 5. That is, the fifth connection conductor 6e is a conductor extending in the vertical direction, a first end (an upper end) thereof is connected to the lower surface of the second end of the signal line 1, and a second end (a lower end) thereof is connected to the upper electrode of the capacitor 5.

The first electronic switch 7a is a transistor (a field-effect transistor) that disconnectably connects the second end of the first inner line 2a and the second grounding conductor 4b. The first electronic switch 7a is, for example, an MOS FET as illustrated in the drawing, a drain terminal thereof is connected to the second end of the first inner line 2a, a source terminal thereof is connected to the second grounding conductor 4b, and a gate terminal thereof is connected to the switch controller 8.

The first electronic switch 7a switches a conduction state between the drain terminal and the source terminal to an open state or a closed state on the basis of a gate signal input to the gate terminal thereof from the switch controller 8. That is, the first electronic switch 7a turns on/off connection between the second end of the first inner line 2a and the second grounding conductor 4b under the control of the switch controller 8.

The second electronic switch 7b is a transistor that disconnectably connects the second end of the second inner line 2b and the second grounding conductor 4b. The second electronic switch 7b is an MOS FET similarly to the first electronic switch 7a, a drain terminal thereof is connected to the second end of the second inner line 2b, a source terminal thereof is connected to the second grounding conductor 4b, and a gate terminal thereof is connected to the switch controller 8.

The second electronic switch 7b switches a conduction state between the drain terminal and the source terminal to an open state or a closed state on the basis of a gate signal input to the gate terminal thereof from the switch controller 8. That is, the second electronic switch 7b turns on/off connection between the second end of the second inner line 2b and the second grounding conductor 4b under the control of the switch controller 8.

The third electronic switch 7c is a transistor that disconnectably connects the first end of the signal line 1 and the first grounding conductor 4a. The third electronic switch 7c is an MOS FET similarly to the first electronic switch 7a and the second electronic switch 7b, a drain terminal thereof is connected to the first end of the signal line 1, a source terminal thereof is connected to the first grounding conductor 4a, and a gate terminal thereof is connected to the switch controller 8. The third electronic switch 7c may be provided between the second end of the signal line 1 and the second grounding conductor 4b instead of between the first end of the signal line 1 and the first grounding conductor 4a (see FIG. 1).

The third electronic switch 7c switches a conduction state between the drain terminal and the source terminal to an open state or a closed state on the basis of a gate signal input to the gate terminal thereof from the switch controller 8. That is, the third electronic switch 7c turns on/off connection between the first end of the signal line 1 and the first grounding conductor 4a under the control of the switch controller 8.

The fourth electronic switch 7d is a transistor that disconnectably connects the lower electrode of the capacitor 5 and the second grounding conductor 4b. The fourth electronic switch 7d is an MOS FET similarly to the first electronic switch 7a, the second electronic switch 7b, and the third electronic switch 7c, a drain terminal thereof is connected to the lower electrode of the capacitor 5, a source terminal thereof is connected to the second grounding conductor 4b, and a gate terminal thereof is connected to the switch controller 8.

The fourth electronic switch 7d switches a conduction state between the drain terminal and the source terminal to an open state or a closed state on the basis of a gate signal input to the gate terminal thereof from the switch controller 8. That is, the fourth electronic switch 7d turns on/off connection between the lower electrode of the capacitor and the second grounding conductor 4b under the control of the switch controller 8. The fourth electronic switch 7d corresponds to the electronic switch for the capacitor in the present invention.

The switch controller 8 is a control circuit that controls the first electronic switch 7a, the second electronic switch 7b, the third electronic switch 7c, and the fourth electronic switch 7d. That is, the switch controller 8 includes four output ports and controls ON/OFF operations of the first electronic switch 7a, the second electronic switch 7b, the third electronic switch 7c, and the fourth electronic switch 7d by individually outputting the gate signal from each of the corresponding output ports and supplying the gate signal to the gate terminals of the first electronic switch 7a, the second electronic switch 7b, the third electronic switch 7c, and the fourth electronic switch 7d.

Figure 2:
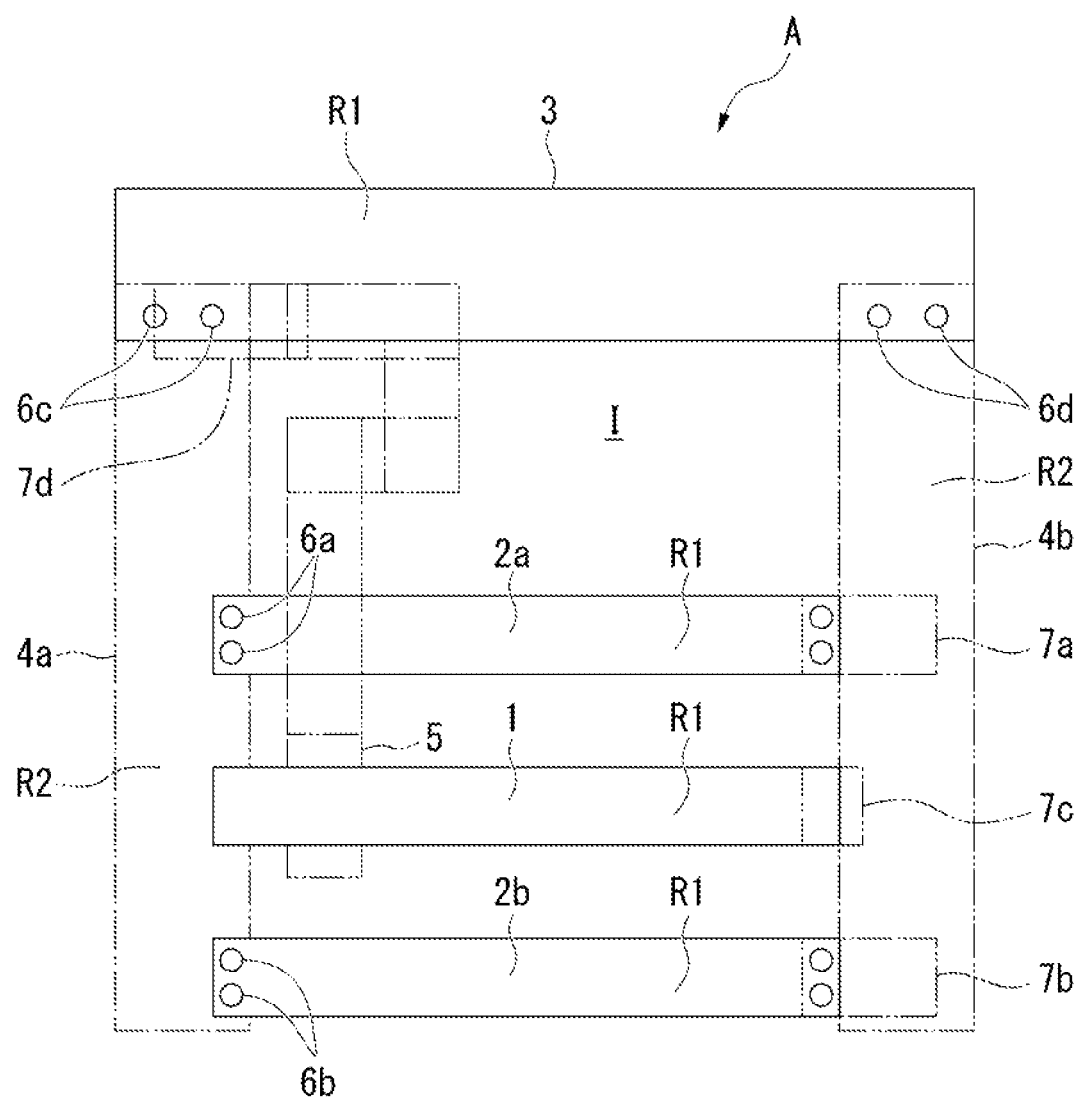
FIG. 2 is a front view illustrating a mounting mode of the digital phase shift circuit A according to the embodiment of the present invention.

A perspective view schematically illustrating the digital phase shift circuit A such that the mechanical structure of the digital phase shift circuit A can be easily understood is illustrated in FIG. 1, but an actual digital phase shift circuit A is formed as a multi-layered structure using semiconductor manufacturing technology as illustrated in FIG. 2.

That is, in the digital phase shift circuit A, the signal line 1, the first inner line 2a, the second inner line 2b, and the outer line 3 are formed in a first conductive layer R1, and the first grounding conductor 4a and the second grounding conductor 4b are formed in a second conductive layer R2 facing the first conductive layer R1 with an insulating layer 1 interposed therebetween. The constituents of the first conductive layer R1, the constituents of the second conductive layer R2, the capacitor 5, and the first to fourth electronic switches 7a to 7d are connected to each other using vias (through-holes). That is, the vias are buried in the insulating layer 1 and serve as the first connection conductor 6a, the second connection conductor 6b, the third connection conductor 6c, and the fourth connection conductor 6d.

In the digital phase shift circuit A having this multi-layered structure, for example, the first grounding conductor 4a and the second grounding conductor 4b are formed of multiple layers in an area outside of the first inner line 2a and the second inner line 2b. More specifically, in an areas which are outer side in the extension direction of the first grounding conductor 4a and the second grounding conductor 4b than ends of the first inner line 2a and the second inner line 2b facing the signal line 1, the first grounding conductor 4a and the second grounding conductor 4b are formed of multiple layers. Lamination of the first grounding conductor 4a and the second grounding conductor 4b achieves a decrease in impedance of the first grounding conductor 4a and the second grounding conductor 4b and achieves a decrease in loss of the digital phase shift circuit A as a whole.

As illustrated in the drawing, a width (a dimension in the vertical direction in FIG. 2) of the outer line 3 is larger than the width of the first inner line 2a and the width of the second inner line 2b. The outer line 3 is formed of multiple layers. An increase in width and lamination of the outer line 3 achieve a decrease in impedance of the outer line 3. By decreasing the impedance of the outer line 3, it is possible to achieve a decrease in difference between the loss of the digital phase shift circuit A in the low delay mode and the loss of the digital phase shift circuit A in the high delay mode.

Only one of the lamination of the first grounding conductor 4a and the second grounding conductor 4b and the increase in width and the lamination of the outer line 3 has to be satisfied as needed. That is, only the lamination of the first grounding conductor 4a and the second grounding conductor 4b may be implemented or only the increase in width and the lamination of the outer line 3 may be implemented.

Operations of the digital phase shift circuit A according to this embodiment will be described below in detail with reference to FIGS. 3A and 3B.

An operation mode of the digital phase shift circuit A is switched according to conduction states of the first to fourth electronic switches 7a, 7b. 7c, and 7d. That is, the operation mode of the digital phase shift circuit A includes a low delay mode in which only the first electronic switch 7a and the second electronic switch 7b are set to the ON state by the switch controller 8 and a high delay mode in which only the fourth electronic switch 7d is similarly set to the ON state by the switch controller 8.

In the low delay mode, the switch controller 8 sets the first electronic switch 7a and the second electronic switch 7b to the ON state and sets the fourth electronic switch 7d to the OFF state. That is, in the low delay mode, a first phase difference θL which is less than a second phase difference θH in the high delay mode is caused due to a first propagation delay time TL until a high-frequency signal propagates from the input end (the second end) of the signal line 1 to the output end (the first end) thereof.

Detailed explanation of the low delay mode is as follows. Since the first electronic switch 7a is set to the ON state, the second end of the first inner line 2a is connected to the second grounding conductor 4b. That is, since the first end of the first inner line 2a is always connected to the first grounding conductor 4a via the first connection conductor 6a and the second end thereof is connected to the second grounding conductor 4b via the first electronic switch 7a, a first current path in which a current can flow between the first end and the second end thereof is formed.

On the other hand, since the second electronic switch 7b is set to the ON state, the second end of the second inner line 2b is connected to the second grounding conductor 4b. That is, since the first end of the second inner line 2b is always connected to the first grounding conductor 4a via the second connection conductor 6b and the second end thereof is connected to the second grounding conductor 4b via the second electronic switch 7b, a second current path in which a current can flow between the first end and the second end thereof is formed.

Figure 3A:
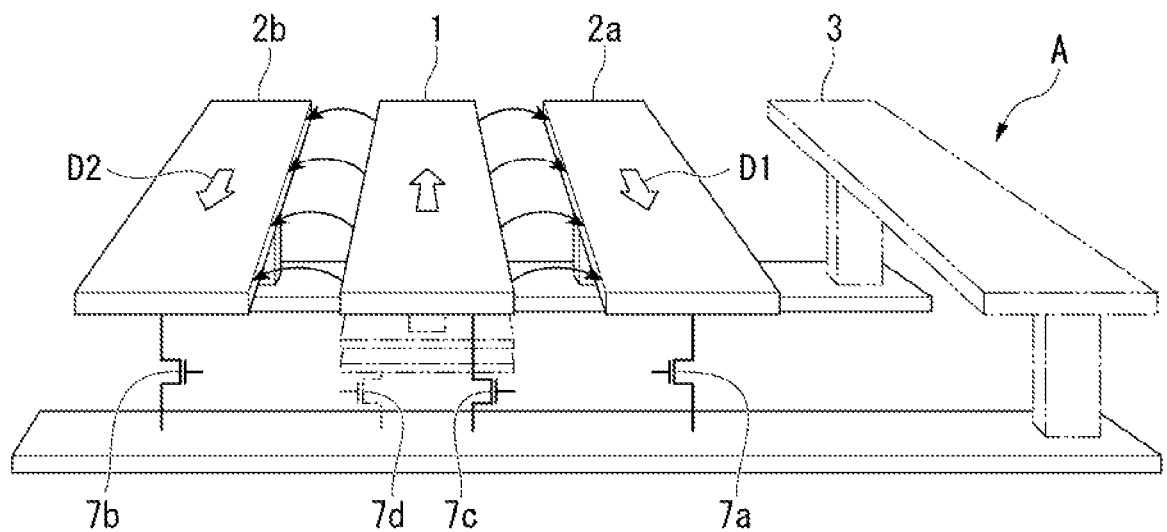
FIG. 3A is a conceptual diagram illustrating a low delay mode of the digital phase shift circuit A according to the embodiment of the present invention.
Figure 3B:
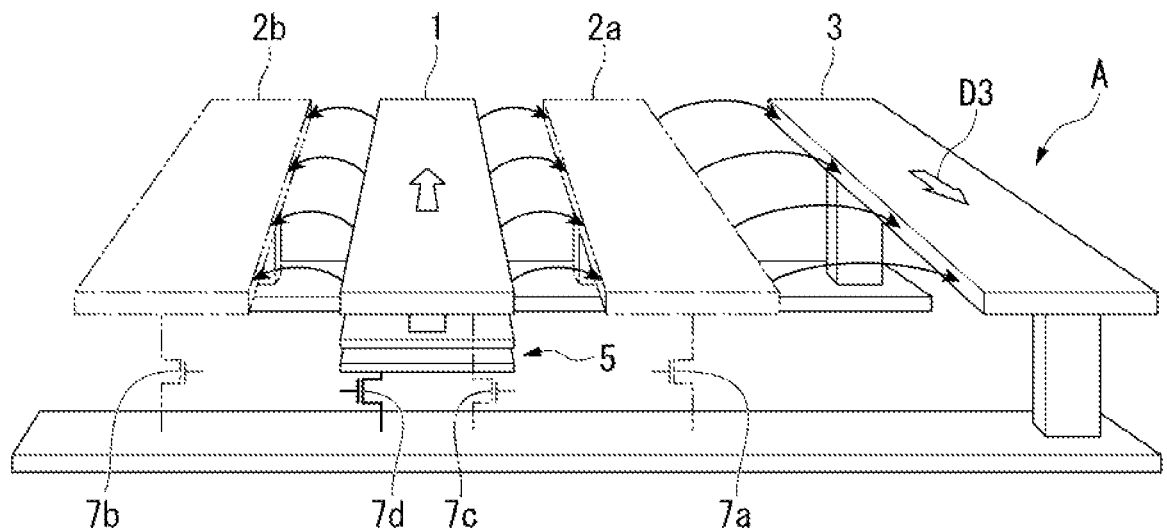
FIG. 3B is a conceptual diagram illustrating a high delay mode of the digital phase shift circuit A according to the embodiment of the present invention.

When a signal current flows from the input end to the output end of the signal line 1 in a state in which both ends of the first inner line 2a are connected, a return current of the signal current flows from the first end to the second end in the first inner line 2a and the second inner line 2b due to propagation of the signal current as illustrated in FIG. 3A.

That is, in the first inner line 2a constituting the first current path, a first return current D1 flowing in a direction opposite to the flow direction of the signal current flows due to flowing of the signal current in the signal line 1. In the second inner line 2b constituting the second current path, a second return current D2 flowing in a direction opposite to the flow direction of the signal current, that is, in the same direction as the first return current D1, flows due to flowing of the signal current in the signal line 1.

Here, flow directions of the first return current D1 flowing in the first inner line 2a and the second return current D2 flowing in the second inner line 2b are both opposite to the flow direction of the signal current. Accordingly, the first return current D1 and the second return current D2 act to decrease the inductance L1 of the signal line 1 due to electromagnetic coupling between the signal line 1 and the first inner line 2a and the second inner line 2b. When a decrease of the inductance L1 is defined as ΔLs, an effective inductance Lm of the signal line 1 is (L1-ΔLs).

The signal line 1 has a capacitance C1 which is a parasitic capacitance as described above. In the low delay mode, since the fourth electronic switch 7d is set to the OFF state, the capacitor 5 is not connected between the signal line 1 and the second grounding conductor 4b. That is, the capacitance Ca of the capacitor 5 does not affect the high-frequency signal propagating in the signal line 1. Accordingly, the first propagation delay time TL which is proportional to (LmxC1)½ acts on the high-frequency signal propagating in the signal line 1.

The high-frequency signal at the output end (the first end) of the signal line 1 is delayed in phase by the first phase difference θL from the high-frequency signal at the input end (the second end) of the signal line 1 due to the first propagation delay time TL. That is, in the low delay mode, the inductance L1 of the signal line 1 is decreased to the inductance Lm due to the first return current D1 and the second return current D2. Accordingly, the original propagation delay time of the signal line 1 is decreased and the first phase difference θL which is less than the original phase difference of the signal line 1 is realized as a result.

In the low delay mode, a loss in the signal line 1 is intentionally increased by setting the third electronic switch 7c to the ON state. This addition of the loss is used for the loss on a high-frequency signal in the low delay mode to be set to the same as the loss on a high-frequency signal in the high delay mode.

That is, the loss of a high-frequency signal in the low delay mode is apparently smaller than the loss of a high-frequency signal in the high delay mode. This loss difference causes an amplitude difference between high-frequency signals output from the digital phase shift circuit A when the operation mode is switched between the low delay mode and the high delay mode. With these circumstances, the amplitude difference is resolved by setting the third electronic switch 7c to the ON state in the low delay mode in the digital phase shift circuit A.

On the other hand, in the high delay mode, the switch controller 8 sets the first electronic switch 7a, the second electronic switch 7b, and the third electronic switch 7c to the OFF state and sets the fourth electronic switch 7d to the ON state. That is, in the high delay mode, a second phase difference θH which is greater than the first phase difference θL in the low delay mode is caused due to a second propagation delay time TH until a high-frequency signal propagates from the input end (the second end) of the signal line 1 to the output end (the first end).

In the high delay mode, since the first electronic switch 7a and the second electronic switch 7b are set to the OFF state, a first current path is not formed in the first inner line 2a, and a second current path is not formed in the second inner line 2b. Accordingly, the first return current D1 flowing in the first inner line 2a becomes much smaller and the second return current D2 flowing in the second inner line 2b becomes much smaller.

On the other hand, the first end of the outer line 3 is connected to the first grounding conductor 4a via the third connection conductor 6c and the second end thereof is connected to the second grounding conductor 4b via the fourth connection conductor 6d. That is, a third current path in which a current can flow between the first end and the second end is formed in advance in the outer line 3. Accordingly, in the high delay mode, a third return current D3 flows from the first end of the outer line 3 to the second end thereof due to the signal current in the signal line 1 as illustrated in FIG. 3B.

The third return current D3 flows in a direction opposite to the flow direction of the signal current in the signal line 1. Accordingly, the third return current D3 can decrease the inductance LA of the signal line 1 due to electromagnetic coupling between the signal line 1 and the outer line 3.

Here, a distance between the signal line 1 and the outer line 3 is larger than a distance between the signal line 1 and the first inner line 2a and the second inner line 2b. Accordingly, the third return current D3 has a weaker effect of decreasing the inductance L1 than the first return current D1 and the second return current D2. When a decrease in the inductance L1 due to the third return current D3 is defined as ΔLh, an effective inductance Lp of the signal line 1 is (L1-ΔLh).

Since the outer line 3 is provided on only a first side of the signal line 1, an effect of decreasing the inductance L1 is weaker in comparison with a case in which the outer line 3 is provided on both sides of the signal line 1.

On the other hand, the signal line 1 has a capacitance C1 which is a parasitic capacitance. In the high delay mode, since the fourth electronic switch 7d is set to the ON state, the capacitor 5 is connected between the signal line 1 and the second grounding conductor 4b. That is, the signal line 1 has a capacitance Cb which is a sum of the capacitance Ca of the capacitor 5 and the capacitance C1 (the parasitic capacitance). Accordingly, the second propagation delay time TH which is proportional to (LpxCb)½ acts on the high-frequency signal propagating in the signal line 1.

The high-frequency signal at the output end (the second end) of the signal line 1 is delayed in phase by the second phase difference θH from the high-frequency signal at the input end of the signal line 1 due to the second propagation delay time TH. That is, in the high delay mode, since the inductance L1 of the signal line 1 is decreased to an inductance Lp due to the third return current D3 and the fourth electronic switch 7d is set to the ON state, the second phase difference θH which is greater than the first phase difference θL in the low delay mode is realized.

In the high delay mode, the third electronic switch 7c is set to the OFF state. That is, in the high delay mode, a process of intentionally increasing the loss in the signal line 1 is not implemented. As a result, the output amplitude of the high-frequency signal in the high delay mode approaches the output amplitude of the high-frequency signal in the low delay mode. The third electronic switch 7c is not essential and may be deleted.

The entire operations of the digital phase shift circuit A according to this embodiment have been described above, and the digital phase shift circuit A achieves the following advantages.

That is, the digital phase shift circuit A according to this embodiment includes the outer line 3 outside of only one of the first inner line 2a and the second inner line 2b. On the other hand, the digital-controlled phase shift circuit according to the related art disclosed in Non-Patent Document 1 employs a configuration in which the outer grounding line is provided for each of a pair of inner grounding lines. Accordingly, according to this embodiment, since the outer line 3 is provided outside of only the first inner line 2a, it is possible to provide a digital phase shift circuit A that can enable a decrease in size in comparison with the related art.

In the digital phase shift circuit A according to this embodiment, the first inner line 2a, the second inner line 2b, and the outer line 3 are formed in the first conductive layer R1 and the first grounding conductor 4a and the second grounding conductor 4b are formed in the second conductive layer R2 facing the first conductive layer R1 with the insulating layer 1 interposed therebetween by using semiconductor manufacturing technology.

According to this embodiment, it is possible to further decrease an occupied volume in a semiconductor chip in which the digital phase shift circuit A is formed in comparison with the related art and thus to realize, for example, a decrease in size of the semiconductor chip. Since the outer line 3 is provided on only a first side of the signal line 1, an effect of decreasing the inductance L1 is weaker in comparison with a case in which the outer line 3 is provided on both sides of the signal line 1.

In the digital phase shift circuit A according to this embodiment, the first electronic switch 7a and the second electronic switch 7b are set to the simultaneously ON (closed) state in the low delay mode, and the first electronic switch 7a and the second electronic switch 7b are set to the simultaneously OFF (open) state in the high delay mode.

According to this embodiment, it is possible to further increase the phase difference in comparison with a case in which only one of the first electronic switch 7a and the second electronic switch 7b is set to the ON state (closed state) in the low delay mode. That is, according to this embodiment, it is possible to set the phase difference against the high delay mode to be larger in comparison with a case in which only one of the first electronic switch 7a and the second electronic switch 7b is set to the ON state (closed state) in the low delay mode.

The digital phase shift circuit A according to this embodiment further includes the capacitor 5 of which the upper electrode is connected to the signal line 1 and the lower electrode is connected to the second grounding conductor 4b. According to this embodiment, it is possible to set the first phase difference θL in the low delay mode and the second phase difference θH in the high delay mode to be larger than those in a case in which the capacitor 5 is not provided.

Here, in the digital phase shift circuit A according to this embodiment, the lower electrode of the capacitor 5 is connected to the second grounding conductor 4b, but the lower electrode of the capacitor 5 may be connected to the first grounding conductor 4a or the lower electrode of the capacitor 5 may be connected to both the first grounding conductor 4a and the second grounding conductor 4b. That is, the upper electrode of the capacitor 5 according to this embodiment may only be connected to the signal line 1 and the lower electrode may only be connected to at least one of the first grounding conductor 4a and the second grounding conductor 4b.

The digital phase shift circuit A according to this embodiment further includes the fourth electronic switch 7d (the electronic switch for the capacitor) between the lower electrode of the capacitor 5 and the second grounding conductor 4b.

According to this embodiment, since the capacitor 5 can be switched between connection and disconnection in the low delay mode and the high delay mode, it is possible to set the difference between the first phase difference θL in the low delay mode and the second phase difference θH in the high delay mode to be larger.

A digital phase shifter B using a plurality of digital phase shift circuits A according to this embodiment will be finally described below.

The digital phase shifter B has a configuration in which a plurality of digital phase shift circuits A according to this embodiment are connected in cascade as illustrated in FIG. 4. That is, the digital phase shifter B is a phase shift circuit in which a first digital phase shift circuit A1, a second digital phase shift circuit A2, (omission), and an n-th digital phase shift circuit An, that is, n digital phase shift circuits A, are linearly connected in cascade.

According to this embodiment, since each of the first digital phase shift circuit A1, the second digital phase shift circuit A2, (omission), and the n-th digital phase shift circuit An is smaller in size than the digital-controlled phase shift circuit according to the related art, it is possible to provide a digital phase shifter B that enables a decrease in size in comparison with the related art.

In the digital phase shift circuit A according to this embodiment, the sizes of the first electronic switch 7a and the second electronic switch 7b may be set to be equal to or greater than a width H1 (see FIG. 4) which is a sum of the width of the second grounding conductor 4b and the width of the first grounding conductor 4a. More preferably, the sizes of the first electronic switch 7a and the second electronic switch 7b are set to be equal to the width H1 or slightly larger than the width H1. Accordingly, it is possible to decrease a loss in the first electronic switch 7a and the second electronic switch 7b.

REFERENCE SIGNS LIST

A: Digital phase shift circuit
B: Digital phase shifter
I: Insulating layer
R1: First conductive layer
R2: Second conductive layer
1: Signal line
2a: First inner line 2b: Second inner line
3: Outer line
4a: First grounding conductor
4b: Second grounding conductor
5: Capacitor
6a: First connection conductor
6b: Second connection conductor
6c: Third connection conductor
6d: Fourth connection conductor
7a: First electronic switch
7b: Second electronic switch
7c: Third electronic switch
7d: Fourth electronic switch (electronic switch for capacitor)
8: Switch controller

The invention claimed is:

1. A digital phase shift circuit comprising:
a signal line that extends in a predetermined direction;
a first inner line that is separated from a first side of the signal line;
a second inner line that is separated from a second side of the signal line;
an outer line that is provided only either at a position which is farther from the signal line than the first inner line on the first side or at a position which is farther from the signal line than the second inner line on the second side;
a first grounding conductor that is provided at each of first end sides of the first inner line, the second inner line, and the outer line;
a second grounding conductor that is provided at a second end of the outer line;
a first connection conductor that connects the first end of the first inner line and the first grounding conductor;
a second connection conductor that connects the first end of the second inner line and the first grounding conductor;
a third connection conductor that connects the first end of the outer line and the first grounding conductor;
a fourth connection conductor that connects the second end of the outer line and the second grounding conductor;
a first electronic switch that disconnectably connects the second end of the first inner line and the second grounding conductor; and
a second electronic switch that disconnectably connects the second end of the second inner line and the second grounding conductor.

2. The digital phase shift circuit according to claim 1, wherein the first grounding conductor and the second grounding conductor are formed of multiple layers outside of the first inner line and the second inner line.

3. The digital phase shift circuit according to claim 1, wherein the outer line has a width larger than a width of the first inner line and a width of the second inner line and is formed of multiple layers.

4. The digital phase shift circuit according to claim 1, wherein the first grounding conductor and the second grounding conductor are formed of multiple layers outside of the first inner line and the second inner line, and
wherein the outer line has a width larger than a width of the first inner line and a width of the second inner line and is formed of multiple layers.

5. The digital phase shift circuit according to claim 1, wherein the first inner line, the second inner line, and the outer line are formed in a first conductive layer, and
wherein the first grounding conductor and the second grounding conductor are formed in a second conductive layer which faces the first conductive layer with an insulating layer interposed therebetween.

6. The digital phase shift circuit according to claim 1, wherein the first electronic switch and the second electronic switch are set to a simultaneously closed state in a low delay mode and are set to a simultaneously open state in a high delay mode.

7. The digital phase shift circuit according to claim 1, wherein the first electronic switch and the second electronic switch are field-effect transistors, and
wherein a size of the field-effect transistors is equal to or greater than a summed length of a width of the first grounding conductor and a width of the second grounding conductor.

8. The digital phase shift circuit according to claim 1, further comprising a capacitor of which an upper electrode is connected to the signal line and a lower electrode is connected to at least one of the first grounding conductor and the second grounding conductor.

9. The digital phase shift circuit according to claim 8, further comprising an electronic switch for a capacitor that is provided between the lower electrode of the capacitor and at least one of the first grounding conductor and the second grounding conductor.

10. The digital phase shift circuit according to claim 9, wherein the electronic switch for the capacitor is set to an open state in a low delay mode and is set to a closed state in a high delay mode.

11. A digital phase shifter in which a plurality of the digital phase shift circuits according to claim 1 are connected in cascade.

* * * * *